United States Patent
Kucharski et al.

(10) Patent No.: US 7,215,194 B2
(45) Date of Patent: May 8, 2007

(54) EXTENDED BANDWIDTH AMPLIFIER AND OSCILLATOR USING POSITIVE CURRENT FEEDBACK THROUGH INDUCTIVE LOAD

(75) Inventors: Daniel Kucharski, Ithaca, NY (US); Kevin Kornegay, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 25 days.

(21) Appl. No.: 10/857,582

(22) Filed: May 28, 2004

(65) Prior Publication Data

US 2005/0264356 A1 Dec. 1, 2005

(51) Int. Cl.
*H03F 3/45* (2006.01)
(52) U.S. Cl. .................. 330/252; 330/253; 330/260
(58) Field of Classification Search ................ 330/252, 330/253; 326/115
See application file for complete search history.

(56) References Cited

U.S. PATENT DOCUMENTS

| | | | | |
|---|---|---|---|---|
| 4,267,516 | A | * | 5/1981 | Traa ............................ 330/252 |
| 5,250,911 | A | * | 10/1993 | Linder et al. ................ 330/252 |
| 6,340,899 | B1 | | 1/2002 | Green |
| 6,670,847 | B1 | | 12/2003 | Rokhsaz |
| 6,765,377 | B1 | * | 7/2004 | Lu .............................. 330/252 |
| 6,774,721 | B1 | * | 8/2004 | Popescu et al. ............. 330/253 |
| 6,909,309 | B2 | * | 6/2005 | Green .......................... 326/115 |
| 2002/0126767 | A1 | | 9/2002 | Ding et al. |
| 2005/0162229 | A1 | * | 7/2005 | Notthoff ...................... 330/252 |

FOREIGN PATENT DOCUMENTS

| | | | |
|---|---|---|---|
| JP | 401098307 A | * | 4/1989 |
| WO | 03/03220 | | 10/2003 |

OTHER PUBLICATIONS

BiCMOS 7HP, http://www-306.ibm.com/chips/techlib/techlib.nsf/products/BiCMOS_7HP.
Foundry Technologies 180-nm CMOS, RF CMOS and SiGe BiCMOS, http://www-306.ibm.com/chips/techlib/techlib.nsf/techdocs/FE154539B8C4C01687256C...
High-performance devices for a wide range of applications: Foundry technologies 180-nm CMOS, RF CMOS and SiGe BiCMOS, 4 pp., Copyright IBM Corporation 2004.
The MOSIS Service: An Integrated Circuit Fabrication Service, 2 pp., http://www.mosis.org/products/fab/vendors/ibm/7hp/.
International Search Report Dated Nov. 14, 2005.

* cited by examiner

*Primary Examiner*—Khanh Van Nguyen
(74) *Attorney, Agent, or Firm*—Marjama & Bilinski LLP (57) ABSTRACT

Circuit topologies that provide extended bandwidth of operation are disclosed. The circuits have two stages that share inductors, in which in-phase current components sum at a summing node and flow together, increasing the magnitude of the current in the inductors. The inductive peaking exhibited by the circuits is increased without using excessively large inductors.

21 Claims, 7 Drawing Sheets

EXTENDED BANDWIDTH AMPLIFIER AND OSCILLATOR USING POSITIVE CURRENT FEEDBACK THROUGH INDUCTIVE LOAD

CROSS-REFERENCE TO RELATED APPLICATIONS

This application is related to co-pending U.S. patent application Ser. No. 10/857,238, entitled "Low Voltage High-Speed Differential Logic Devices and Method of Use Thereof," filed contemporaneously herewith on May 28, 2004, which application is subject to assignment to the same assignee as this application, and which application is incorporated herein by reference in its entirety.

FIELD OF THE INVENTION

This invention is generally related to design of broadband amplifiers and oscillators and more specifically to achieving bandwidth extension or sustained oscillation by using current feedback or feed-forward through inductive loads.

BACKGROUND OF THE INVENTION

Inductive peaking is a popular way of achieving bandwidth extension in broadband amplifiers. An increase in inductor impedance with frequency can be used to counteract the effects of decreasing gain caused by device parasitics. This helps to maintain constant amplifier gain into high frequencies and to achieve a flat bandwidth with a higher—3dB roll-off point. However, inductive peaking is more effective at high AC current levels, because larger current densities require smaller inductors. Small inductors perform better in high-speed circuits, as they tend to have higher self-resonant frequencies. However, if low power operation is a design goal, the size of peaking inductors has to increase. Currently, spiral inductors are some of the largest on-chip components, and can occupy a disproportionately large share of silicon real estate, which translates into higher cost.

There is a need for a design that provides good inductive peaking while also providing a reduction in the size of the inductor, and that can work effectively in circuits employing low currents.

SUMMARY OF THE INVENTION

Figure 1:
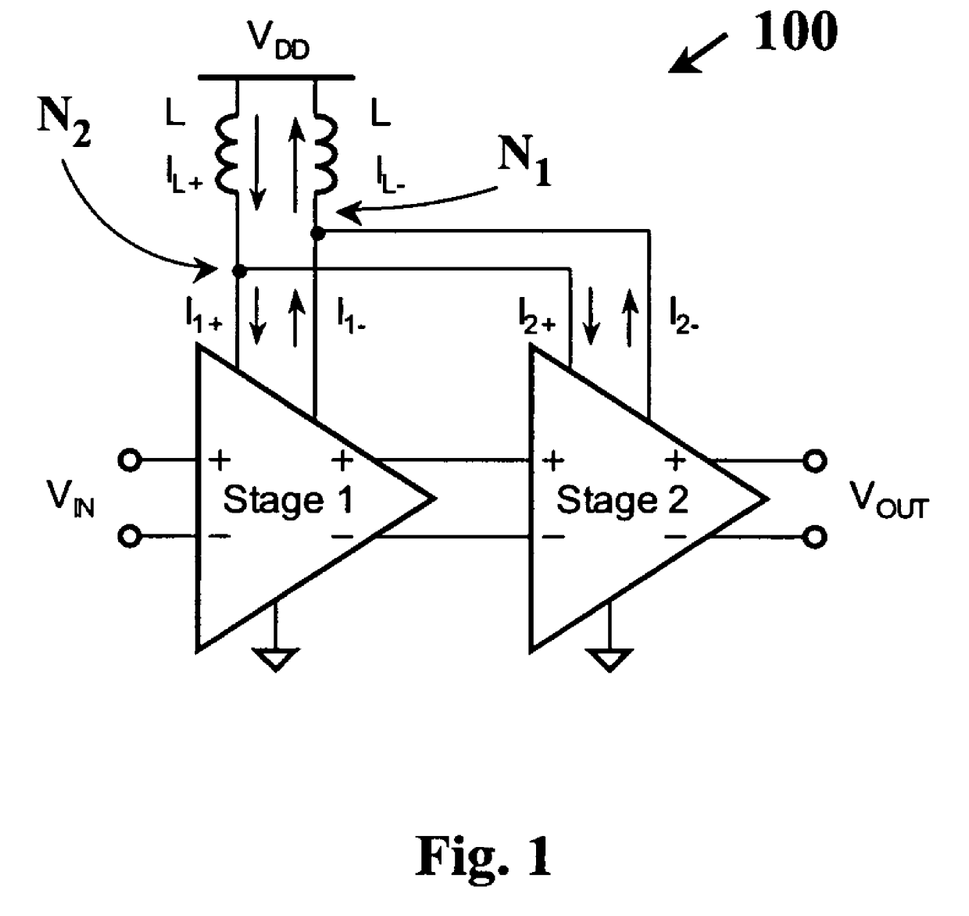
FIG. 1 illustrates an exemplary embodiment showing the general topology of circuits providing inductive peaking, according to principles of the invention.

The invention makes full use of the relationship for voltage in an inductor, namely $V_L$=L di/dt. The inductive peaking voltage will be increased if the inductance L can be increased, although increasing L usually implies employing a physically larger inductor. The inductive peaking will also be increased, at a given frequency, if the current i(t) is increased, as di(t)/dt will be larger for the same time differential dt if i(t) is increased. Operating at higher frequency will also increase di(t)/dt for a given i(t). However, the operating frequency of a circuit for a given application cannot always be increased because of constraints imposed by the application. The invention was conceived as a way to reduce size of inductors necessary for achieving bandwidth extension through inductive peaking. In an illustrative general embodiment, two consecutive amplifier stages share inductors in which in-phase current components sum, as shown in FIG. 1, and as explained in greater detail hereinafter.

In one aspect, the invention relates to an extended bandwidth active circuit device. The extended bandwidth active circuit device comprises at least two inductors, each inductor having an inductance, a first terminal, and a second terminal, each first terminal thereof in common electrical communication; a plurality of active circuit elements, each of the active circuit elements having a first terminal and a second terminal, at least a first pair of active circuit elements and a second pair of active circuit elements configured to conduct mutually in-phase current components; and two summing nodes, each summing node having an electrical connection to a first terminal of one member of the first pair of active circuit elements and a first terminal of one member of the second pair of active circuit elements, the electrical connection configured so that the in-phase current components sum at the summing nodes, each of the summing nodes in electrical communication with a respective one of the second terminals of the inductors. When the in-phase current components sum and flow through the two inductors, the circuit provides inductive peaking.

In one embodiment, the inductive peaking is proportional to a first derivative of the summed in-phase current component. In one embodiment, the inductive peaking is proportional to a sum of the inductances of the inductors.

In one embodiment, the extended bandwidth active circuit device further comprises a first reference voltage terminal and a second reference terminal. The first terminal of the inductors in common electrical communication is in electrical communication with a selected one of the first and the second reference voltage terminals. The respective second terminals of one member of the first pair and one member of the second pair of active circuit elements are in electrical communication with the other of the first and second reference voltage terminals.

In one embodiment, the active circuit device comprises an amplifier. In one embodiment, the active circuit device comprises an oscillator. In one embodiment, the active circuit device comprises at least one of an emitter follower, a source follower, a common emitter, a common source, a common base, a common gate, and a differential pair.

In one embodiment, the extended bandwidth active circuit device further comprises supplemental circuitry. In one embodiment, the supplemental circuitry comprises a local feedback.

In one embodiment, the active circuit device comprises a single ended input. In one embodiment, the active circuit device comprises a differential input. In one embodiment, the active circuit device comprises a transistor. In one embodiment, the transistor is a selected one of a junction transistor and a field effect transistor. In one embodiment, the active circuit device comprises a transconductance device. In one embodiment, at least one of the inductors is a circuit component exhibiting inductive characteristics and comprising one or more of a capacitor, a resistor and an active device.

In another aspect, the invention features an extended bandwidth active circuit device. The extended bandwidth active circuit device comprises at least two inductors, each inductor having an inductance, a first terminal, and a second terminal, each first terminal thereof in common electrical communication; a plurality of active circuit elements, each of the active circuit elements having a first terminal and a second terminal, at least first, second and third active circuit elements, of which the first and the second active circuit elements are configured to conduct mutually in-phase current components and the third active circuit element is configured to conduct a common return current substantially equal to a sum of the in-phase circuit components, the third active circuit element having a terminal in electrical communication with a selected one of the second terminals of the inductors; at least one summing node having an electrical connection to a first terminal of the first active circuit element and a first terminal of the second active circuit element, the electrical connection configured so that the in-phase current components sum at the summing node, the at least one summing node in electrical communication with another one of the second terminals of the inductors. When the in-phase current components sum and flow through the two inductors, the circuit provides inductive peaking.

In one embodiment, the inductive peaking is proportional to a first derivative of the summed in-phase current component. In one embodiment, the inductive peaking is proportional to a sum of the inductances of the inductors.

In yet another aspect, the invention relates to a method of providing inductive peaking in an extended bandwidth active circuit device. The method comprises the steps of generating in a circuit having at least two active circuit elements at least two currents having mutually in-phase current components; summing the at least two in-phase current components at a summing node to generate a summed current component; and applying the summed current component to at least one inductor, the at least one inductor having an inductance. When the in-phase current components sum and flow through the at least one inductor, inductive peaking is provided in the circuit.

In one embodiment, the inductive peaking is proportional to a first derivative of the summed in-phase current component. In one embodiment, the inductive peaking is proportional to a sum of the inductances of the at least one inductor.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

Turning to FIG. 1, there is presented a schematic diagram 100 showing an illustrative general embodiment of a circuit in which two consecutive amplifier stages share inductors, in which in-phase current components $I_{1+}$ and $I_{2+}$ that sum at the summing node $N_1$ and flow together as current $I_{L+}$ (and corresponding in-phase elements $I_{1-}$ and $I_{2-}$ sum to $I_{L-}$ at summing node $N_2$), increasing the magnitude of i(t) in the inductors, according to principles of the invention. Also, in order to provide a particular bandwidth enhancement while limiting inductor size, it is advantageous to use two smaller inductors that sum to a total inductance of a desired magnitude. On well known electrical engineering principles, two inductors having inductances $L_1$ and $L_2$ in series are equivalent to a single inductor having inductance $L_1+L_2$. The in-phase currents used by the two stages can be summed together to effectively increase the current density in the inductors, so long as the delay between stages is short. This improves bandwidth extension without increasing inductor size or adding additional inductors. This technique can be thought of as a combination of signal feed-forward from stage 1 to stage 2, and signal feedback from stage 2 to stage 1. With proper device sizing, the positive feedback aspect can be emphasized to create an oscillator circuits. The details of this technique, including a few circuit examples, are provided hereinbelow. Furthermore, the operation of the exemplary circuits constitutes a method of providing inductive peaking in an extended bandwidth active circuit device. The method of operating involves generating at least two currents having mutually in-phase current components; summing the at least two in-phase current components at a summing node to generate a summed current component, and applying the summed current component to at least one inductor. The in-phase current components sum and flow through the at least one inductor to provide inductive peaking in the circuit.

Figure 2:
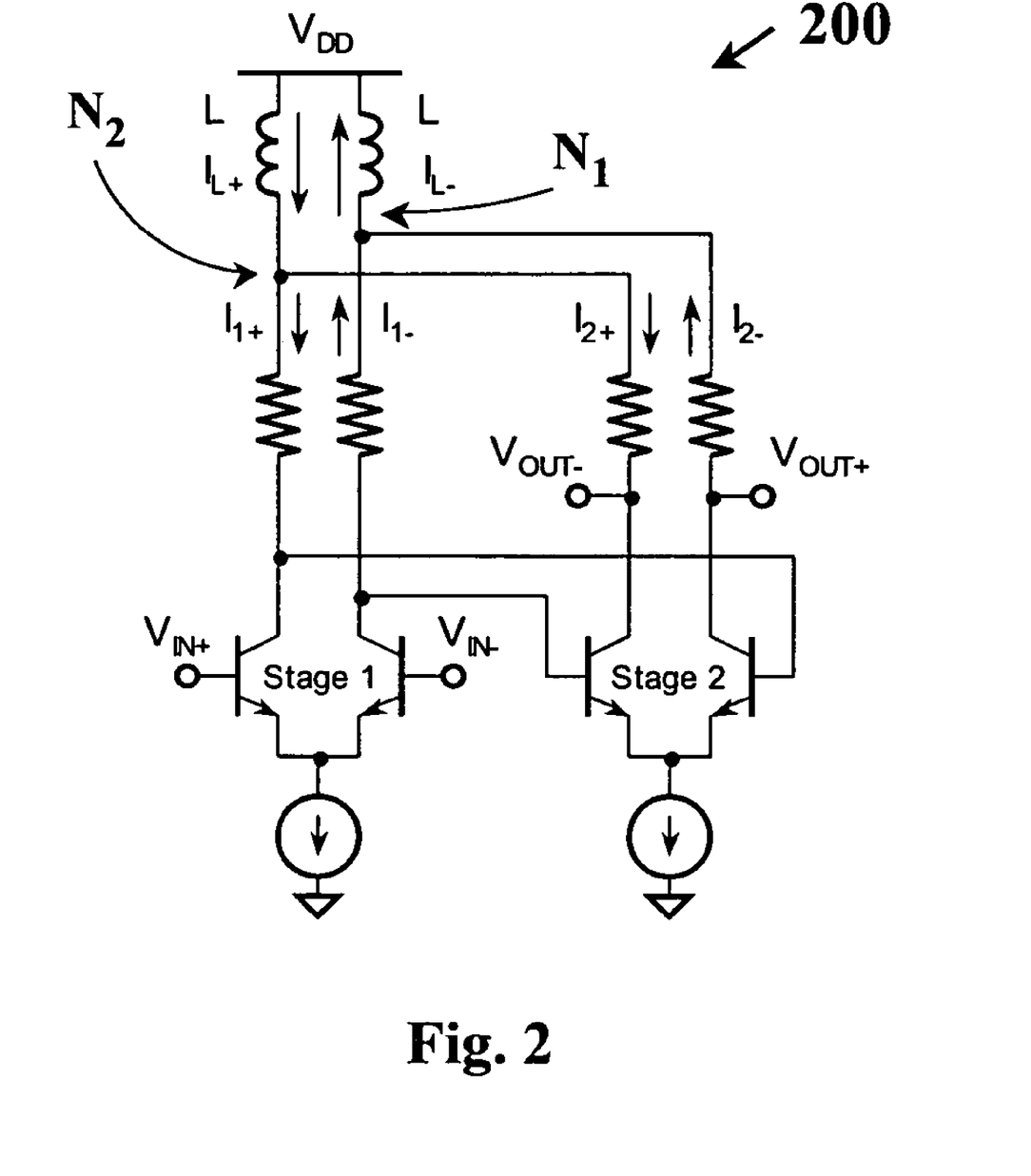
FIG. 2 illustrates an exemplary embodiment showing bandwidth enhancement in cascaded differential amplifiers, according to principles of the invention.

FIG. 2 is a schematic diagram 200 that illustrates an exemplary embodiment showing bandwidth enhancement in cascaded differential amplifiers. The currents $I_1$ and $I_2$ are added in phase when flowing through inductors L, resulting in an increased AC current density, as described hereinabove. The differential amplifiers have differential input nodes $V_{IN+}$ and $V_{IN-}$ and differential output nodes $V_{OUT+}$ and $V_{OUT-}$. There is therefore a positive feedback that can result in instability if the inductance is large relative to the frequency of operation and the tail current magnitudes. The instability can manifest itself as underdamped response or even sustained large amplitude oscillations. Fortunately, at high frequencies this deleterious effect can be mitigated by using smaller inductors that have appropriate inductance L and that require less real estate on an integrated circuit chip.

Figure 3:
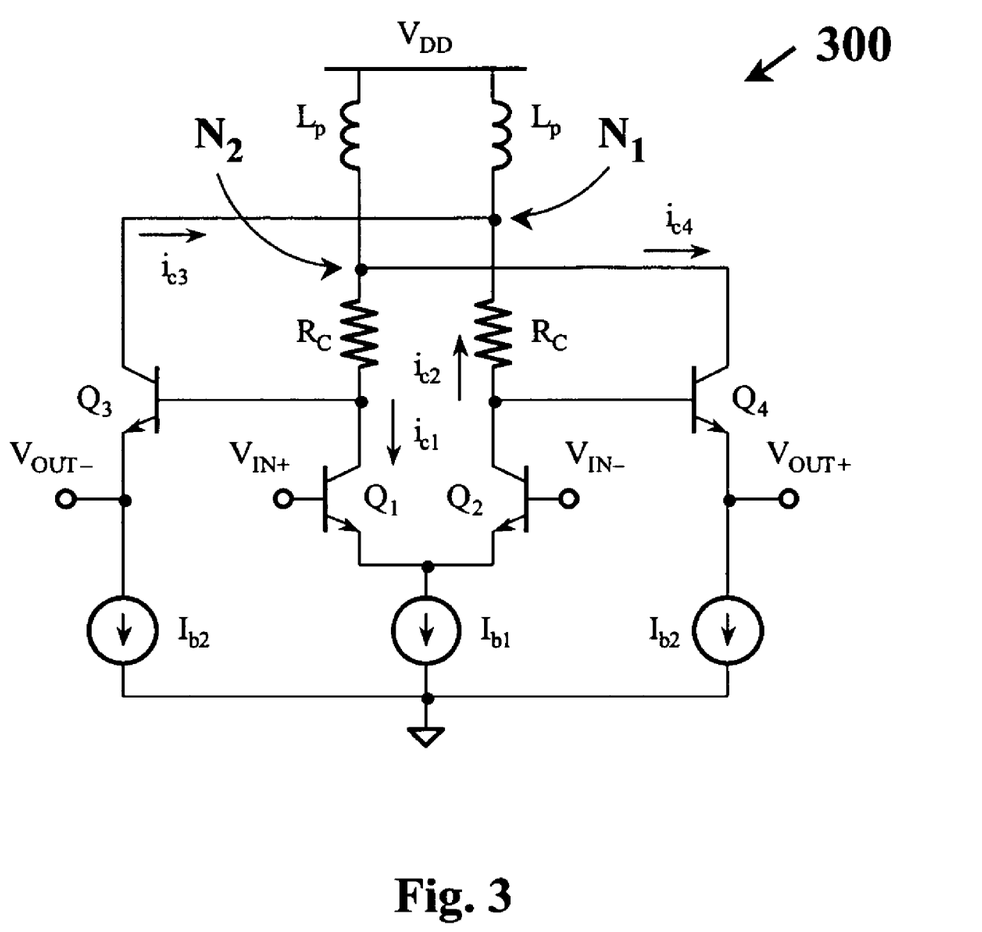
FIG. 3 illustrates an exemplary embodiment showing bandwidth enhancement in cascaded differential amplifier and emitter followers, according to principles of the invention.

The techniques that embody the principles of the invention can be extended to any combination of amplifier stages that exhibit in-phase current components. FIG. 3 is a schematic diagram 300 that illustrates an exemplary embodiment showing bandwidth enhancement in a cascaded single differential amplifier stage and a pair of emitter follower buffers. This type of two-stage amplifier is commonly used in DC-coupled broadband amplifiers because of the improved isolation and inherent DC level shift provided by emitter followers. The differential amplifier circuit comprises a differential pair $Q_1$–$Q_2$ loaded with resistors $R_C$ in series with peaking inductors $L_p$. The differential amplifier has input nodes $V_{IN+}$ and $V_{IN-}$. The differential stage drives a pair of emitter followers $Q_3$ and $Q_4$, which function as unity-gain buffers and level shifters. Each buffer has a respective output node $V_{OUT+}$ and $V_{OUT-}$. The topology is novel in that the collector currents of $Q_3$ and $Q_4$ are supplied through peaking inductors $L_p$. The cross-coupled connection provides positive feedback at high frequencies. The in-phase currents $I_{c2}$ and $I_{c3}$ sum at node $N_1$, and the currents $I_{c1}$ and $I_{c4}$ sum at node $N_2$. In this configuration, inductors carry more AC current, and therefore their size can be reduced to achieve the same peaking effect. The amount of peaking can be adjusted by changing bias currents $I_{b2}$. Also, by using device multiplicity, only part of the emitter follower collector current can be supplied through the inductors. Multiple stages like that in FIG. 3 can be cascaded to create high-gain broadband amplifiers in a smaller chip area or using smaller bias currents compared to conventional inductively-peaked broadband amplifiers.

Figure 4A:
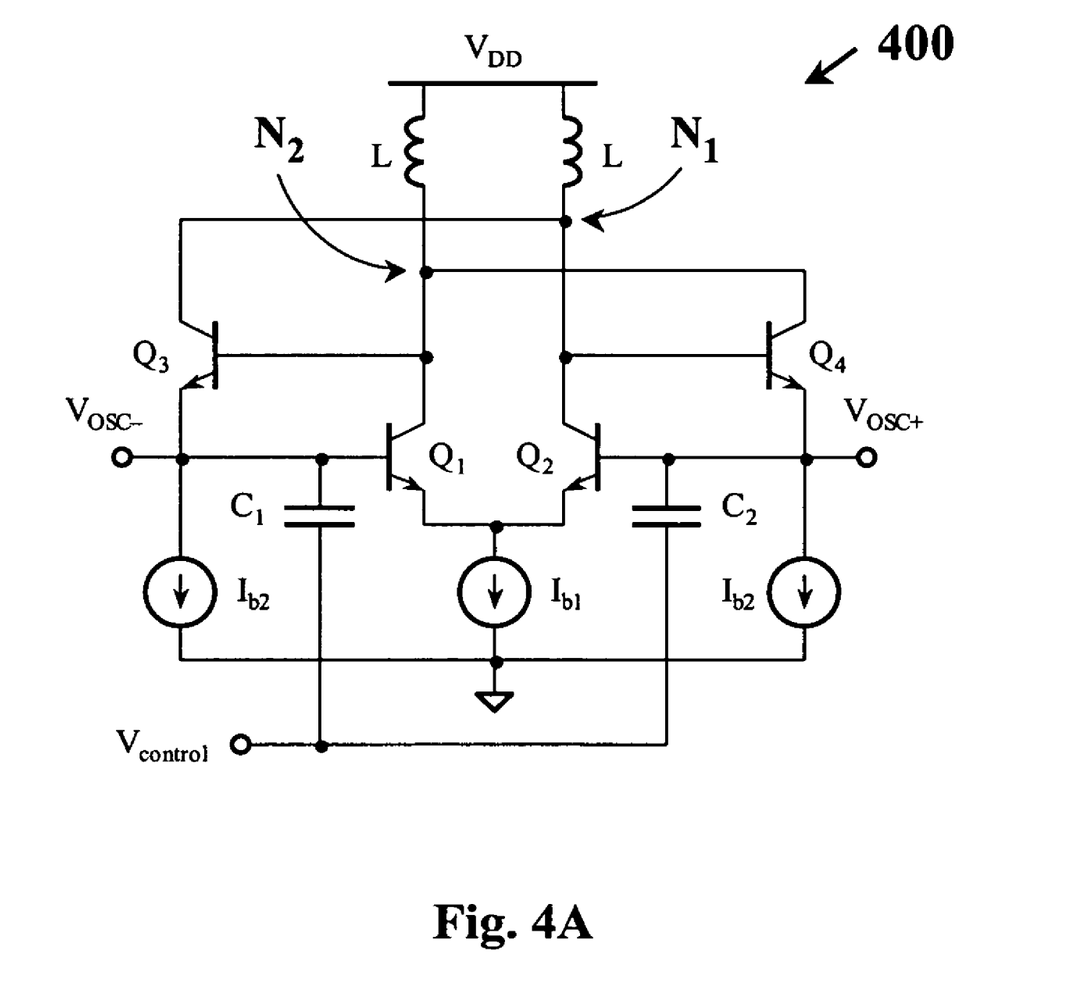
FIGS. 4A and 4B illustrate exemplary embodiments showing oscillator topologies, according to principles of the invention.
Figure 4B:
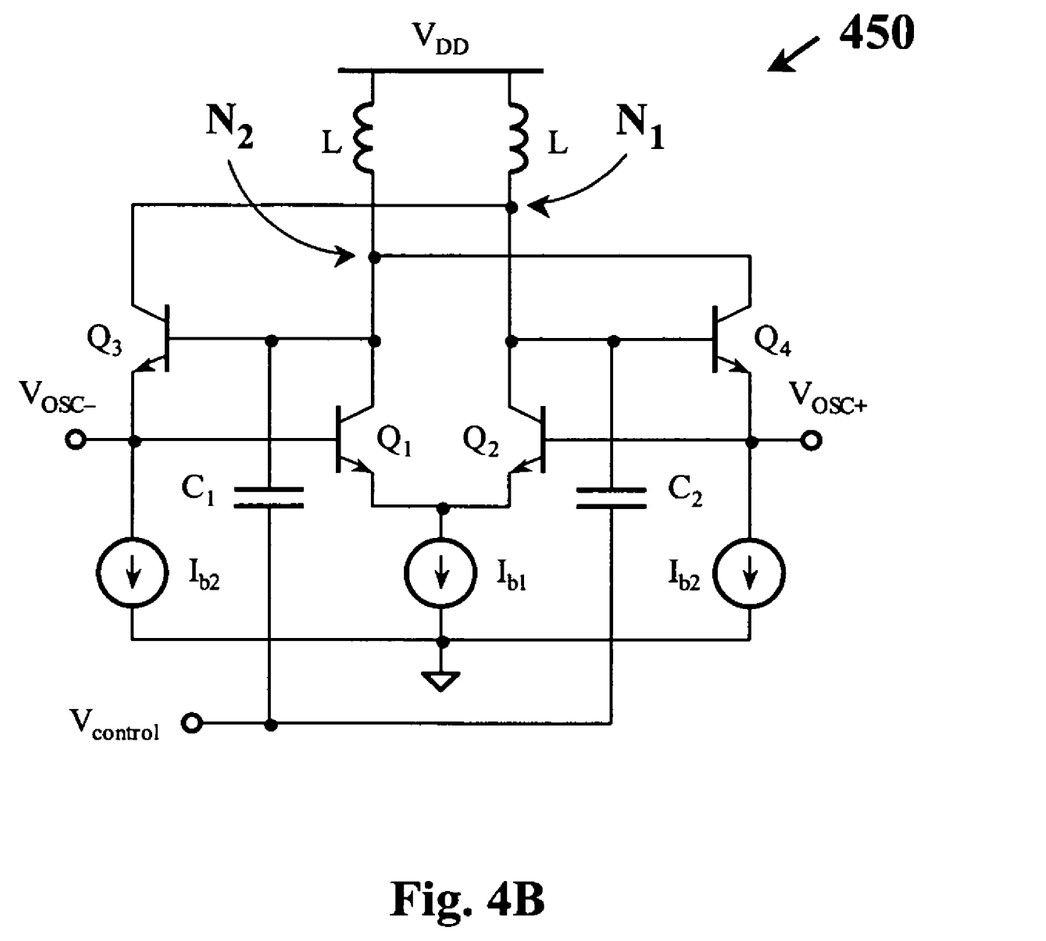

The positive current feedback technique developed for the amplifier can be easily adapted to oscillator design. In two embodiments, shown in FIGS. 4A and 4B as schematic diagrams 400, 450, novel oscillator topologies are created by modifying the circuit of FIG. 3: the inputs of the differential amplifier are in electrical communication with the output terminals of the emitter follower buffers, and resistors $R_C$ are removed and replaced with more conductive electrical connections. The connection of the outputs of the emitter followers to the inputs of the differential amplifier (e.g., the emitter of $Q_4$ is in electrical communication with the base of $Q_2$, and the emitter of $Q_3$ is in electrical communication with the base of $Q_1$) forms a negative feedback loop, which sets a stable DC operating point for transistors $Q_1$–$Q_4$. Oscillations arise as a result of high frequency positive feedback caused by the collector currents of $Q_3$ and $Q_4$ flowing through the inductors L. This is distinctly different from the way in which typical cross-coupled oscillators are biased. In these cross-coupled oscillator circuits, the same feedback path is used for high and low frequencies, but positive feedback at the desired oscillation frequency is obtained with a frequency selective LC tank. The frequency of oscillation can be controlled by fixed or variable capacitors. In FIG. 4A the capacitors $C_1$ and $C_2$ are connected respectively between the output terminals of the oscillator and a control voltage source having voltage $V_{control}$ (or equivalently, connected respectively between the bases of $Q_1$ and $Q_2$ and the control voltage source). In FIG. 4B the capacitors $C_1$ and $C_2$ are respectively connected between one of the bases of $Q_3$ and $Q_4$ and a control voltage source having voltage $V_{control}$. The differential output of the oscillator is taken from an output terminal that provides $V_{OSC-}$ and an output terminal that provides $V_{OSC+}$ in one embodiment. Alternatively, outputs can be taken at nodes $N_1$ and $N_2$, respectively. In some embodiments, the inductors are replaced with LC tanks. Any combination of stages can be used to create an oscillator if positive feedback is sufficiently strong. As described hereinabove, the in-phase emitter currents of $Q_2$ and $Q_3$ sum at node $N_1$, and the in-phase emitter currents of $Q_1$ and $Q_4$ sum at node $N_2$.

The schematics in FIG. 1 through FIGS. 4A–4B in the embodiments presented employ BJT devices, but these circuits can be implemented using FETs, or any other type of transistor. In some embodiment, a circuit according to principles of the invention can be implemented with a single ended input, as described hereinbelow. In some embodiments, current sources can be replaced with resistors to reduce voltage headroom requirement. The technique is also applicable to active inductors (e.g., a circuit component exhibiting inductive characteristics) constructed from a combination of active devices, resistors, and capacitors. The inductors are shown in the embodiments illustrated as having one terminal connected to $V_{DD}$, commonly understood to be a reference voltage of supply voltage different from ground. However, in some embodiment, the inductors can have one terminal connected to a ground potential. Furthermore, the technique can be employed in circuitry where the potential difference across the circuit is provided by one reference voltage of $V_1$ volts, and a second reference voltage of $V_2$ volts, neither of which is ground potential, but where the voltage difference between $V_1$ and $V_2$ is sufficient to operate the circuit of interest. Many equivalents or variants of the circuits presented as examples herein will become apparent to those of ordinary skill in the circuit arts, including circuits that employ active circuit device comprising at least one of an emitter follower, a source follower, a common emitter, a common source, a common base, a common gate, and a differential pair. Equally, those of ordinary skill will understand that a circuit component according to the invention can be employed in a circuit with supplemental circuitry, for example in an integrated circuit having need for an oscillator, an amplifier, or other circuitry embodying the principles of the invention.

Figure 5A:
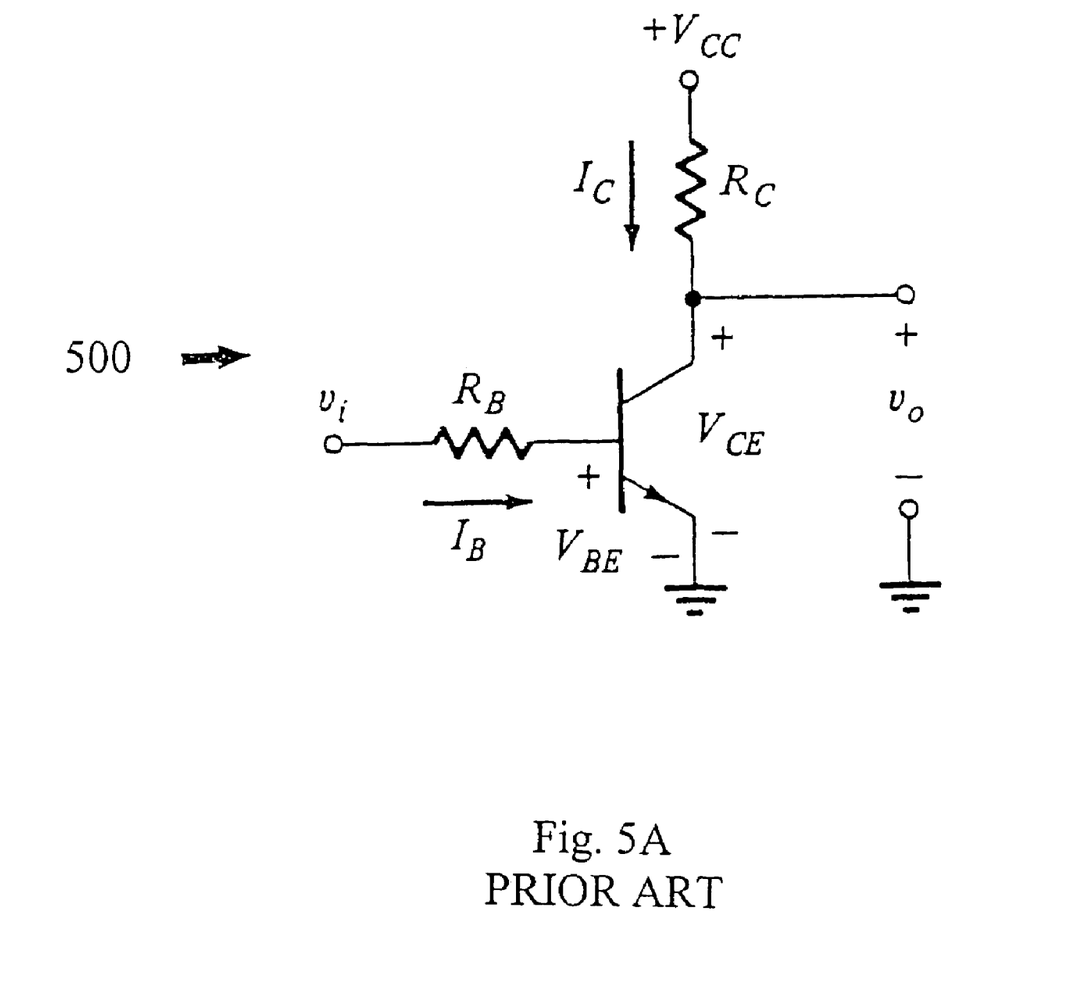
FIGS. 5A and 5B are circuit diagrams of prior art inverters that can be used to convert a differential input into a single ended input.
Figure 5B:
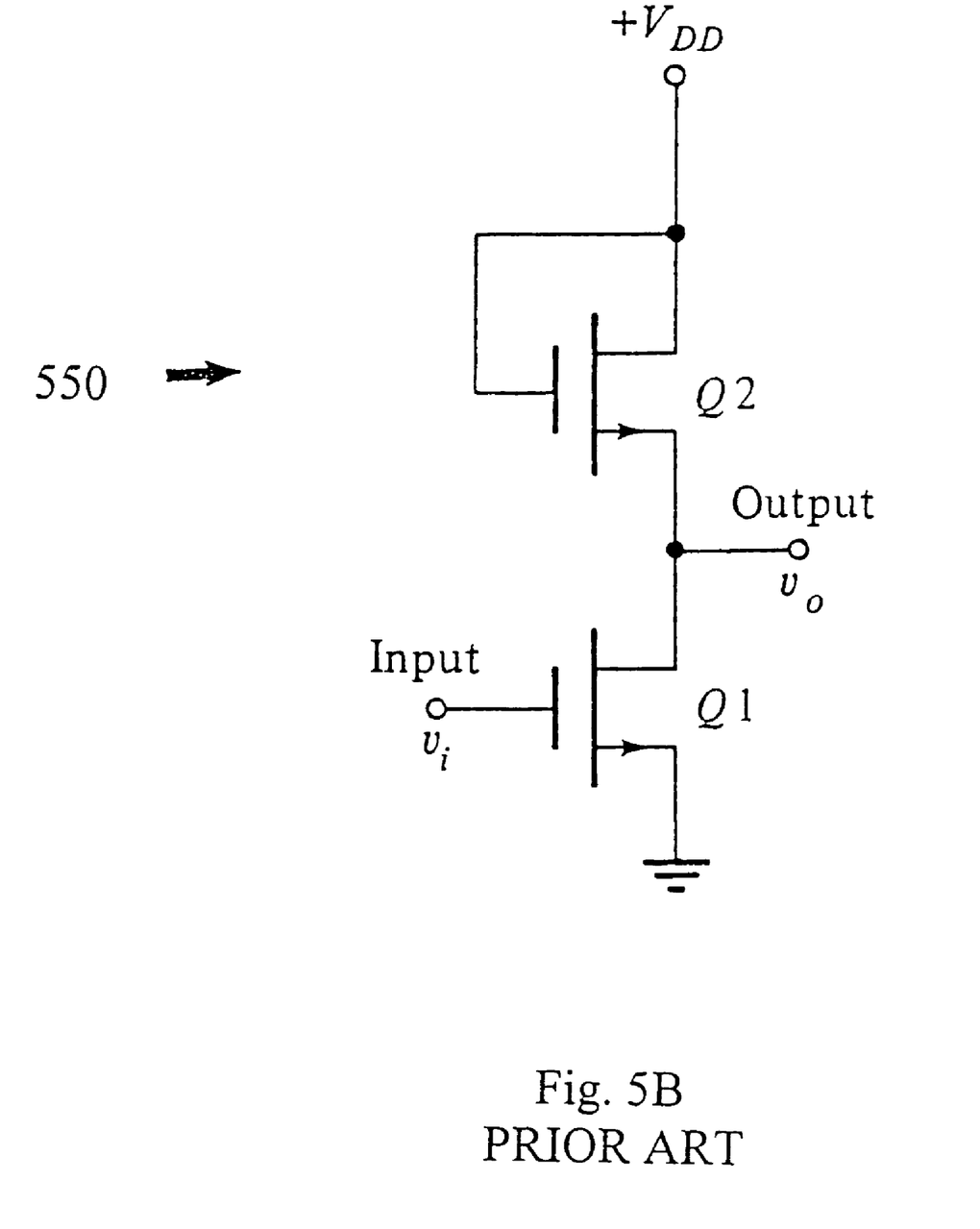

FIGS. 5A and 5B are circuit diagrams of prior art inverters that can be used to convert a differential input into a single ended input. FIG. 5A is a schematic diagram 500 that illustrates a simple BJT inverter circuit that is described in Millman and Grabel, *Microelectronics* ($2^{nd}$ Edition. McGraw-Hill, Inc, New York, 1987), at pages 241–243, the entire disclosure of which pages is incorporated herein by reference. FIG. 5B is a schematic diagram 550 that illustrates a simple MOSFET inverter circuit that is described in Millman and Grabel at pages 226–232, the entire disclosure of which pages is incorporated herein by reference. In brief, each inverter has an input terminal that receives an input signal having a voltage $v_i$ and an output terminal that provides an output signal having a voltage $v_o$, both voltages referenced to a common reference voltage such as ground. As is well known in the circuit arts, an inverter is a circuit that satisfies the logical relationship, expressed for a binary system having two states 0 and 1 (for example on-off, or high-low), that the output takes the state 1 if and only if the input does not take the state 1. In practice, inverter gates have finite delays (related to the switching time of the active elements therein), so the output signal takes an inverted state that is well defined relative to the input after the delay period. In the circuits described herein that embody principles of the invention, it is possible in another embodiment to additionally provide an inverter stage that takes its input signal from the direct input of any of the differential input gates described hereinabove, and provides its output signal to the one or more corresponding inverted input gate of the circuit, thereby allowing operation of the circuit using a single ended input. For example, in FIG. 2, one can add an inverter stage having an input terminal in electrical communication with input terminal $V_{IN+}$ and an output terminal in electrical communication with input terminal $V_{IN-}$ so as to permit the so–modified circuit of FIG. 2 to operate using a single input signal.

Circuits embodying the principles of the invention have been reduced to practice using commercially available BiCMOS technology. For example, test circuits according to each of the circuits shown in FIGS. 2, 3 and 4 have been fabricated using SiGe (silicon-germanium) materials and the 7HP process. These fabrication materials and technologies are well known to those in the integrated circuit arts, and will not be explained herein in detail. For additional information, the reader can see, for example, the web page http://www-306.ibm.com/chips/techlib/techlib.nsf/products/BiCMOS_7HP. IBM states on that page that "BiCMOS 7HP is a 0.18-μm technology that incorporates a high-performance SiGe bipolar device optimized for high-speed or low-power applications. It is ideally suited to applications in the 40-to 100-GHz frequency space, such as fiber-optic communication transceivers and automotive proximity sensors." Additional documents are available by download from that web page, including a document entitled "Foundry Technologies 180-nm CMOS, RF CMOS and SiGe BiCMOS." Another source of information is the web page http://www.mosis.org/products/fab/vendors/ibm/7hp/. The MOSIS page states that "MOSIS is offering access to the IBM 0.18 micron SiGe BiCMOS 7HP technology for prototype and low volume fabrication." Those of ordinary skill will understand that the manufacturing technology used is not per se a critical detail in employing aspects of the invention, and that circuits embodying principles of the invention can be fabricated using many different methods, including possibly connecting discrete devices in suitable topological configurations.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been explained with reference to the structure disclosed herein, it is not confined to the details set forth, and this invention is intended to cover any modifications and changes as may come within the scope and spirit of the following claims.

What is claimed is:

1. An extended bandwidth active circuit device, comprising:
    at least two inductors, each inductor having an inductance, a first terminal, and a second terminal, each first terminal thereof in common electrical communication;
    a plurality of active circuit elements, each of said active circuit elements having a first terminal and a second terminal, at least a first pair of active circuit elements and a second pair of active circuit elements configured to conduct mutually in-phase current components; and
    two summing nodes, each summing node having an electrical connection to a first terminal of one member of said first pair of active circuit elements and a first terminal of one member of said second pair of active circuit elements, said electrical connection configured so that said in-phase current components sum at said summing nodes, each of said summing nodes in electrical communication with a respective one of said second terminals of said inductors;
    whereby, when said in-phase current components sum and flow through said two inductors, said extended bandwidth active circuit device provides inductive peaking.

2. The extended bandwidth active circuit device according to claim 1, wherein said inductive peaking is proportional to a first derivative of said summed in-phase current component.

3. The extended bandwidth active circuit device according to claim 1, wherein said inductive peaking is proportional to a sum of said inductances of said inductors.

4. The extended bandwidth active circuit device according to claim 1, further comprising:
    a first reference voltage terminal and a second reference voltage terminal; and
    wherein said first terminal of said inductors in common electrical communication are in electrical communication with a selected one of said first and said second reference voltage terminals; and
    wherein said respective second terminals of one member of said first pair and one member of said second pair of active circuit elements are in electrical communication with the other of said first and said second reference voltage terminals.

5. The extended bandwidth active circuit device according to claim 1, wherein said extended bandwidth active circuit device comprises an amplifier.

6. The extended bandwidth active circuit device according to claim 1, wherein said extended bandwidth active circuit device comprises an oscillator.

7. The extended bandwidth active circuit device according to claim 1, wherein said extended bandwidth active circuit device comprises at least one of an emitter follower, a source follower, a common emitter, a common source, a common base, a common gate, and a differential pair.

8. The extended bandwidth active circuit device according to claim 7, further comprising supplemental circuitry.

9. The extended bandwidth active circuit device according to claim 8, wherein said supplemental circuitry comprises a local feedback.

10. The extended bandwidth active circuit device according to claim 1, wherein said extended bandwidth active circuit device comprises a single ended input.

11. The extended bandwidth active circuit device according to claim 1, wherein said extended bandwidth active circuit device comprises a differential input.

12. The extended bandwidth active circuit device according to claim 1, wherein said extended bandwidth active circuit device comprises a transistor.

13. The extended bandwidth active circuit device according to claim 12, wherein said transistor is a selected one of a junction transistor and a field effect transistor.

14. The extended bandwidth active circuit device according to claim 1, wherein said extended bandwidth active circuit device comprises a transconductance device.

15. The extended bandwidth active circuit device according to claim 1, wherein at least one of said inductors is a circuit component exhibiting inductive characteristics and comprising one or more of a capacitor, a resistor and an active device.

16. An extended bandwidth active circuit device, comprising:
    at least two inductors, each inductor having an inductance, a first terminal, and a second terminal, each first terminal thereof in common electrical communication;
    a plurality of active circuit elements, each of said active circuit elements having a first terminal and a second terminal, at least first, second and third active circuit elements, of which said first and said second active circuit elements are configured to conduct mutually in-phase current components and said third active circuit element is configured to conduct a common return current substantially equal to a sum of said in-phase current components, said third active circuit element having a terminal in electrical communication with a selected one of said second terminals of said inductors;

at least one summing node having an electrical connection to a first terminal of said first active circuit element and a first terminal of said second active circuit element, said electrical connection configured so that said in-phase current components sum at said summing node, said at least one summing node in electrical communication with another one of said second terminals of said inductors;

whereby, when said in-phase current components sum and flow through said two inductors, said extended bandwidth active circuit device provides inductive peaking.

17. The extended bandwidth active circuit device according to claim 16, wherein said inductive peaking is proportional to a first derivative of said summed in-phase current component.

18. The extended bandwidth active circuit device according to claim 16, wherein said inductive peaking is proportional to a sum of said inductances of said inductors.

19. A method of providing inductive peaking in an extended bandwidth active circuit device, comprising the steps of:

generating in a circuit having at least two active circuit elements at least two currents having mutually in-phase current components;

summing said at least two in-phase current components at a summing node to generate a summed current component; and applying said summed current component to at least one inductor, said at least one inductor having an inductance;

whereby, when said in-phase current components sum and flow through said at least one inductor, inductive peaking is provided in said extended bandwidth active circuit device.

20. The method according to claim 19, wherein said inductive peaking is proportional to a first derivative of said summed in-phase current component.

21. The method according to claim 19, wherein said inductive peaking is proportional to an equivalent inductance of said at least one inductor.

* * * * *